(12) United States Patent
Liu

(10) Patent No.: US 11,189,980 B2
(45) Date of Patent: Nov. 30, 2021

(54) OPTIMIZATION ANALYSIS METHOD AND SYSTEM FOR HIGH-SPEED SIGNAL CONNECTOR

(71) Applicant: ZHENGZHOU YUNHAI INFORMATION TECHNOLOGY CO., LTD., Henan (CN)

(72) Inventor: Fazhi Liu, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 197 days.

(21) Appl. No.: 16/493,256

(22) PCT Filed: Aug. 31, 2018

(86) PCT No.: PCT/CN2018/103439
§ 371 (c)(1),
(2) Date: Sep. 11, 2019

(87) PCT Pub. No.: WO2019/091197
PCT Pub. Date: May 16, 2019

(65) Prior Publication Data
US 2020/0119508 A1    Apr. 16, 2020

(30) Foreign Application Priority Data
Nov. 9, 2017   (CN) .......................... 201711100088.4

(51) Int. Cl.
*H01R 43/16*      (2006.01)
*G01R 31/66*      (2020.01)
(Continued)

(52) U.S. Cl.
CPC ............. *H01R 43/16* (2013.01); *G01R 31/66* (2020.01); *H01P 5/08* (2013.01); *H01R 12/71* (2013.01)

(58) Field of Classification Search
CPC ........ H01R 43/16; H01R 12/71; G01R 31/66; G01R 31/70; H01P 5/08; G06F 11/3409;
(Continued)

(56) References Cited

U.S. PATENT DOCUMENTS 7,087,844 B2 *   8/2006   Ishimaru ................ H05K 1/111
                                                                          174/250
10,756,488 B2 *  8/2020   Tsai ..................... H01R 13/642
2007/0165389 A1   7/2007  Ahn

FOREIGN PATENT DOCUMENTS

CN         101005732 A       7/2007
CN         104219880 A      12/2014
(Continued)

OTHER PUBLICATIONS

International Search Report for PCT/CN2018/103439 dated Nov. 30, 2018, ISA/CN.

*Primary Examiner* — Donghai D Nguyen
(74) *Attorney, Agent, or Firm* — Yue (Robert) Xu; Apex Attorneys at Law, LLP

(57) ABSTRACT

An analysis method and an analysis system for optimization of a high-speed signal connector are provided. The method includes: setting an excess portion of each of a pin and a pad in the high-speed signal connector to be different lengths; equating the excess portion of each of the pin and the pad with an inductor and a capacitor; analyzing performance of connectors having different lengths of the excess portion of the pin and different lengths of the excess portion of the pad, and comparing performance parameters of the connectors; and obtaining a length of the excess portion of the pin and a length of the excess portion of the pad in a case of an optimal performance parameter, and cutting the pin and the pad based on the obtained lengths.

8 Claims, 3 Drawing Sheets

(51) Int. Cl.
*H01P 5/08* (2006.01)
*H01R 12/71* (2011.01)

(58) Field of Classification Search
CPC ........ Y10T 29/49155; Y10T 29/49156; H05K 1/111
USPC .................................................. 29/846, 847
See application file for complete search history.

(56) References Cited

FOREIGN PATENT DOCUMENTS

| | | |
|---|---|---|
| CN | 106410462 A | 2/2017 |
| CN | 206480630 U | 9/2017 |
| CN | 107918581 A | 4/2018 |

\* cited by examiner

OPTIMIZATION ANALYSIS METHOD AND SYSTEM FOR HIGH-SPEED SIGNAL CONNECTOR

The present application is a national phase application of PCT international patent application PCT/CN2018/103439, filed on Aug. 31, 2018 which claims the priority to Chinese Patent Application No. 201711100088.4, titled "OPTIMIZATION ANALYSIS METHOD AND SYSTEM FOR HIGH-SPEED SIGNAL CONNECTOR", filed on Nov. 9, 2017 with China National Intellectual Property Administration, both of which are incorporated herein by reference in their entireties.

FIELD

The present disclosure relates to the field of signal transmission, and in particular to an analysis method and analysis system for optimization of a high-speed signal connector.

BACKGROUND

Backplane connectors are a type of connector commonly used in large communication devices, ultra-high-performance servers, supercomputers, industrial computers and high-end storage devices. The main function of the backplane connector is to connect a single board and the backplane having a vertical structure of 90 degrees there between, and to transmit high-speed differential signals or single-ended signals and transmit large current.

A connector is an indispensable component in an electronic device, and the connector connects two active devices to transmit current or signals. The connector establishes communication at a blocked site in the circuit or between separated disconnected circuits, thus to allow current to flow and enable the circuit to perform an intended function.

An existing connector continues to adopt a traditional design of PIN. The connection PIN in the high-speed connector is too long, which not only causes additional material costs, but also causes a case that more PIN stub of the connector and PIN stub in the board may result in loss of signal quality.

SUMMARY

An analysis method for optimization of a high-speed signal connector is provided according to the present disclosure, the analysis method includes: setting an excess portion of a pin in the high-speed signal connector to be different lengths and setting an excess portion of a pad in the high-speed signal connector to be different lengths; equating the excess portion of the pin with an inductor and a capacitor, and equating the excess portion of the pad with another inductor and another capacitor; analyzing performance of connectors having different lengths of the excess portion of the pin and different lengths of the excess portion of the pad, and comparing performance parameters of the connectors; and obtaining a length of the excess portion of the pin and a length of the excess portion of the pad in a case of an optimal performance parameter, and cutting the pin and the pad based on the length of the excess portion of the pin and the length of the excess portion of the pad in a case of the optimal performance parameter.

An analysis system for optimization of a high-speed signal connector is provided according to the present disclosure, the analysis system includes a length setting module, an equating module, a performance analysis module and a cutting length determining module. The length setting module is configured to set an excess portion of a pin in the high-speed signal connector to be different lengths and set an excess portion of a pad in the high-speed signal connector to be different lengths. The equating module is configured to equate the excess portion of the pin with an inductor and a capacitor, and equate the excess portion of the pad with another inductor and another capacitor. The performance analysis module is configured to analyze performance of connectors having different lengths of the excess portion of the pin and different lengths of the excess portion of the pad, and comparing performance parameters of the connectors. The cutting length determining module is configured to obtain a length of the excess portion of the pin and a length of the excess portion of the pad in a case of an optimal performance parameter, and cut the pin and the pad based on the length of the excess portion of the pin and the length of the excess portion of the pad in a case of the optimal performance parameter.

BRIEF DESCRIPTION OF THE DRAWINGS

The drawings to be used in the description of the embodiments or the conventional technology are described briefly as follows, so that the technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION

In order to make the person skilled in the art have a better understanding of a solution of the present disclosure, the present disclosure is described hereinafter in further detail in conjunction with the drawings and embodiments. It is apparent that embodiments described below are only some embodiments of the present disclosure, rather than all of the embodiments. Based on the embodiments of the present disclosure, all of other embodiments, made by those skilled in the art without any creative efforts, fall into the protection scope of the present disclosure.

An analysis method and an analysis system for optimization of a high-speed signal connector according to an embodiment of the present disclosure will be described in detail below with reference to the accompanying drawings.

Figure 1:
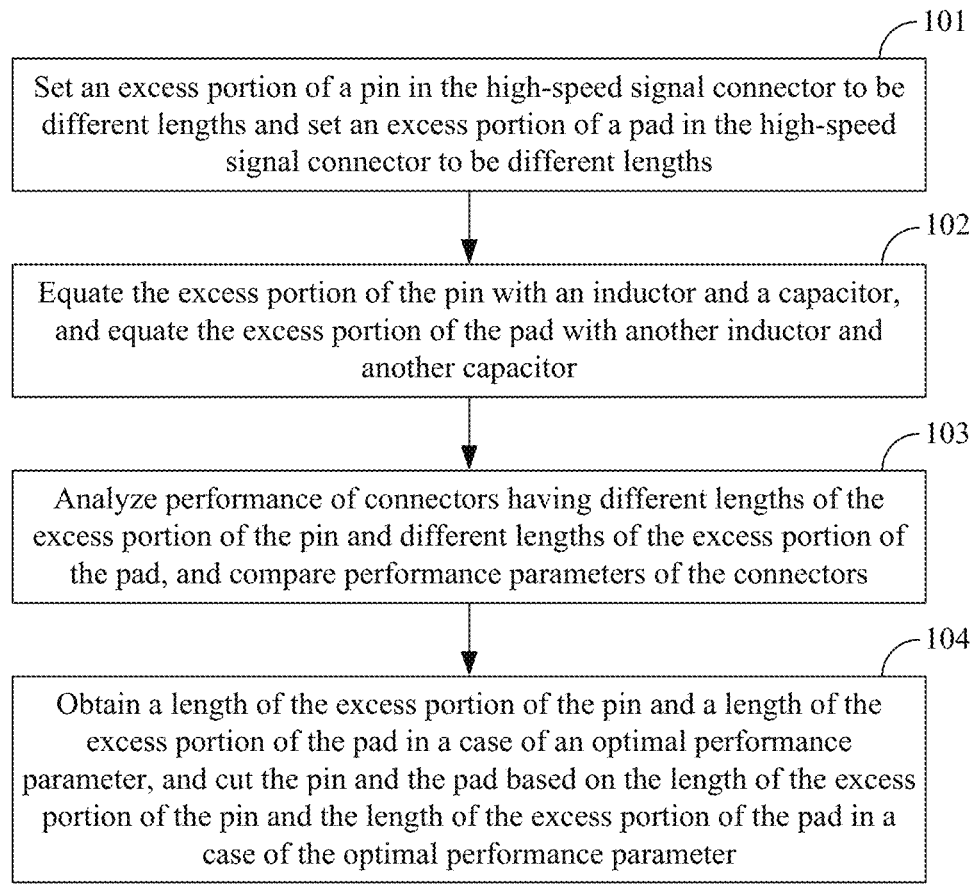
FIG. 1 is a flowchart of an analysis method for optimization of a high-speed signal connector according to an embodiment of the present disclosure.

As shown in FIG. 1, an analysis method for optimization of a high-speed signal connector according to an embodiment of the present disclosure includes steps S101 to S104.

In step S101, an excess portion of a pin in the high-speed signal connector is set to be different lengths, and an excess portion of a pad in the high-speed signal connector is set to be different lengths.

In step S102, the excess portion of the pin is equated with an inductor and a capacitor, and the excess portion of the pad is equated with another inductor and another capacitor.

In step S103, performance of connectors having different lengths of the excess portion of the pin and different lengths of the excess portion of the pad is analyzed, and performance parameters of the connectors are compared.

In step S104, a length of the excess portion of the pin and a length of the excess portion of the pad in a case of an optimal performance parameter is obtained, and the pin and the pad are cut based on the length of the excess portion of the pin and the length of the excess portion of the pad in a case of the optimal performance parameter.

Figure 2:
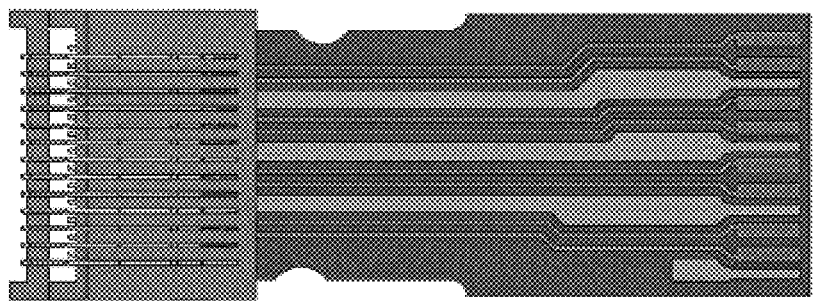
FIG. 2 is a schematic diagram of an outline of a connector according to an embodiment of the present disclosure.

The connector usually includes a plastic connection socket and a small circuit board or flexible circuit board composed of high-speed wires. In the connector as shown in FIG. 2, the socket on the left side may be inserted into the backplane or other board, a joint of the connection circuit board on the right side may be connected to an external device such as a signal cable.

Figure 3:
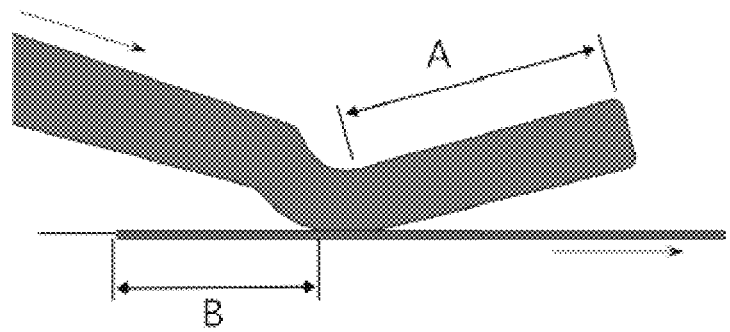
FIG. 3 is a schematic diagram of a pin in a connector according to an embodiment of the present disclosure.

The pin in the traditional high-speed connector is shown in FIG. 3. The excess portion A of the pin and the excess portion B of the pad in the connector are too long, and the excess portions will generate extra capacitance and inductance during signal transmission, thus affecting transmission of a high speed signal.

Since the connector transmits the high-speed signal, and the transmission of the high-speed signal requires a high-speed line, that is to say, the pin in the connector and the pad in the connector serve as the high-speed line. A model of the high-speed line is equivalent to a combination of a capacitor and an inductor. When a signal is transmitted at a high-speed line, it is transmitted in the form of electromagnetic waves.

An excess portion of a pin in the connector is set to be different lengths, and an excess portion of a pad in the connector is set to be different lengths.

In the Hspice software, the pin in the connector is equated with an inductor and a capacitor, and an excess portion of the pin is equated with an inductor L1 and a capacitor C1, and an excess portion of the pad is equated with an inductor L2 and a capacitor C2, according to following formulas:

$$L1=4(0.01*D)/(d1/D+0.44),$$

where D is a diameter of the pin, and d1 is a length of the excess portion of the pin;

$$L2=4(0.01*D)/(d2/D+0.44),$$

where D is the diameter of the pin, and d2 is a length of the excess portion of the pad;

$$C1=4\varepsilon/d1,$$

where $\varepsilon$ is a dielectric constant, and d1 is the length of the excess portion of the pin; and $$C2=4\varepsilon/d2,$$

where $\varepsilon$ is the dielectric constant, and d2 is the length of the excess portion of the pad.

The relevant parameters in the Hspice software are set to the above-mentioned magnitudes of the inductor and the capacitor, to obtain insertion loss and return loss.

Figure 4:
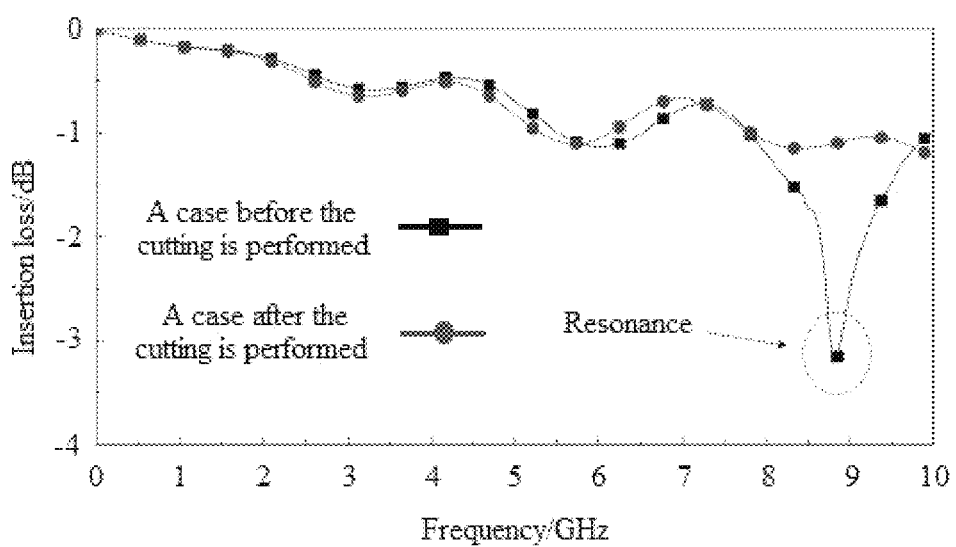
FIG. 4 is a diagram showing comparison of insertion loss corresponding to different lengths of a pin and a pad according to an embodiment of the present disclosure.
Figure 5:
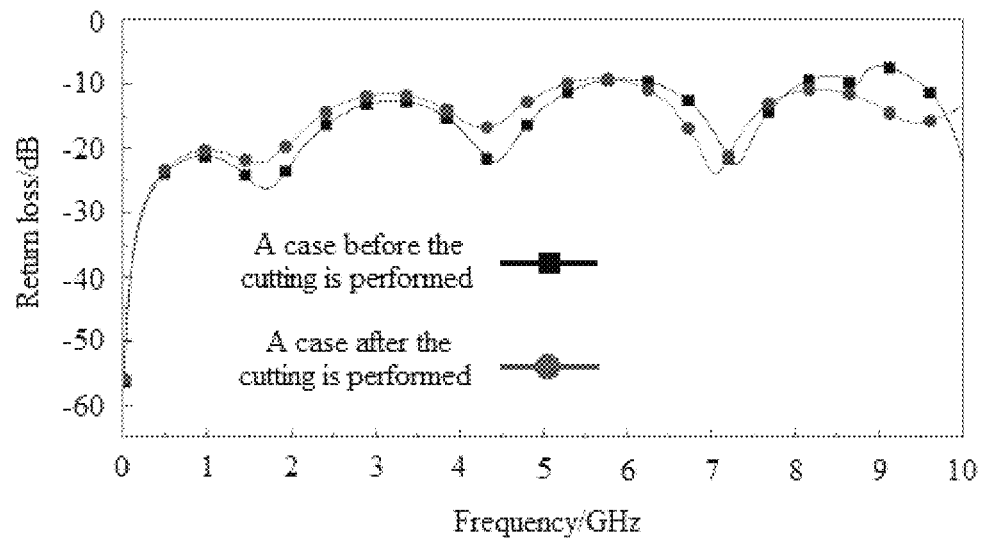
FIG. 5 is a diagram showing comparison of return loss corresponding to different lengths of a pin and a pad according to an embodiment of the present disclosure.

Parameters of the insertion loss and the return loss, in cases of different lengths of the excess portions of the pin and different lengths of the excess portion of the pad, are obtained and compared. In the present embodiment, the performance of the connector having an original length and the performance of the connector, in which a portion is cut, are analyzed, and the performance comparison between a case before the cutting is performed and a case after the cutting is performed is shown in FIGS. 4 and 5.

In the case of the original length of the pin and the pad, a resonance phenomenon may occur in the insertion loss. The resonance may greatly affect the transmission quality of the signal in the high-speed line, and may form a back-and-forth reflection between the signal pins. This reflection causes loss of electromagnetic signal, and the continuous reflection may oscillate the signal waveform. After the length is shortened, the resonance phenomenon disappears, which indicates that the connector in which a portion is cut has a large improvement in signal transmission quality in terms of the insertion loss parameter.

With regard to the return loss, when the frequency is less than 60 GHz, the return loss corresponding to the original length is basically the same as the return loss corresponding to shortened length. However, when the frequency exceeds 60 GHz, the signal loss corresponding to the shortened length is smaller than the signal loss corresponding to the original length.

Since an end of the pin or pad is equivalent to an open circuit, there is a signal reflection problem. It is verified that the resonance phenomenon occurs when the excess portion has a length of a quarter of the signal wavelength. The signal wavelength is the product of the signal period and the rate, namely L=T*V, where T represents the signal period and V represents the rate. A smaller remaining pin and pad leads to a smaller impact on high-speed signal and a lower material cost.

Performance of connectors having different lengths of the excess portion of the pin and different lengths of the excess portion of the pad is analyzed. A length of the excess portion of the pin and a length of the excess portion of the pad in a case of an optimal performance parameter is obtained, and the pin and the pad are cut based on the length of the excess portion of the pin and the length of the excess portion of the pad in a case of the optimal performance parameter.

In the embodiments of the present disclosure, the excess portion of the pin in the connector is equated with an inductor and a capacitor and the excess portion of the pad in the connector is equated with another inductor and another capacitor, performance is analyzed by using the Hspice software to obtain the length of the excess portion of the pin and the length of the excess portion of the pad in a case of the optimal performance parameter, and then the pin and the pad are cut according to the obtained lengths, which solves the problem that a signal quality is affected due to too long pin and pad in the existing connector, and thus to reduce loss in signal transmission and improve the signal quality. Cutting of the pin helps reduce the cost of materials, and cutting of the pad helps remain more space for wiring and achieve ease of design.

Figure 6:
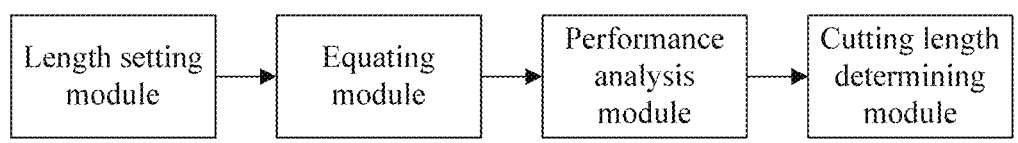
FIG. 6 is a structural block diagram of an analysis system for optimization of a high-speed signal connector according to an embodiment of the present disclosure.

As shown in FIG. 6, an analysis system for optimization of a high-speed signal connector is provided according to an embodiment of the present disclosure. The analysis system includes a length setting module, an equating module, a performance analysis module and a cutting length determining module.

The length setting module is configured to set an excess portion of a pin in the high-speed signal connector to be different lengths and set an excess portion of a pad in the high-speed signal connector to be different lengths.

The equating module is configured to equate the excess portion of the pin with an inductor and a capacitor, and equate the excess portion of the pad with another inductor and another capacitor.

Following formulas are used in the equating module:

$$L1=4(0.01*D)/(d1/D+0.44),$$

where D is a diameter of the pin, and d1 is the length of the excess portion of the pin;

$$L2=4(0.01*D)/(d2/D+0.44),$$

where D is the diameter of the pin, and d2 is the length of the excess portion of the pad;

$$C1=4\varepsilon/d1,$$

where $\varepsilon$ is a dielectric constant, and d1 is the length of the excess portion of the pin; and $$C2=4\varepsilon/d2,$$

where $\varepsilon$ is the dielectric constant, and d2 is the length of the excess portion of the pad.

The performance analysis module is configured to analyze performance of connectors having different lengths of the excess portion of the pin and different lengths of the excess portion of the pad, and compare performance parameters of the connectors.

The performance parameter includes a magnitude of insertion loss, a magnitude of return loss and whether there is a resonance phenomenon.

The cutting length determining module is configured to obtain a length of the excess portion of the pin and a length of the excess portion of the pad in a case of an optimal performance parameter, and cut the pin and the pad based on the length of the excess portion of the pin and the length of the excess portion of the pad in a case of the optimal performance parameter.

The optimal performance parameter is selected based on a criterion that the insertion loss and the return loss are smaller and there is no resonance phenomenon.

Embodiments in this specification are described in a progressive manner, each of the embodiments emphasizes differences between the embodiment and other embodiments, and the same or similar parts among the embodiments can be referred to each other. Since the devices disclosed in the embodiment corresponds to the method disclosed in the embodiment, the description for the device is simple, and reference may be made to the method in the embodiment for the relevant parts.

As further be appreciated by those skilled in the art, the units and algorithmic steps in the examples described according to the embodiments disclosed herein can be implemented in forms of an electronic hardware, computer software or the combination thereof. To illustrate the interchangeability of the hardware and the software clearly, the components and the steps in the examples are described generally according to functions in the above description. Whether the function is executed in a hardware way or in a software way depends on applications of the technical solution and design constraint conditions. For each specific application, different methods may be used by those skilled in the art to implement the described function, and such implementation should not be considered as departing from the scope of the innovation.

The steps of the method or algorithm described according to the embodiments disclosed herein may be implemented in forms of hardware, a software module executed by a processor or the combination thereof. The software module may be stored in a Random Access Memory (RAM), a memory, a Read-Only Memory (ROM), an electrically programmable ROM, an electrically erasable programmable ROM, a register, a hardware disk, a movable magnetic disk, CD-ROM or any other forms of storage medium well known in the art.

In the above, the analysis method and the analysis system for optimization of a high-speed signal connector according to the present disclosure are described in detail. The principle and embodiments of the present disclosure are described through specific examples herein. The description of the above-described embodiments is merely used to facilitate understanding the method and core idea of the present disclosure. It should be noted that, for those skilled in the art, many modifications and improvements may be made to the present disclosure without departing from the principle of the present disclosure, and these modifications and improvements are also deemed to fall into the protection scope of the present disclosure defined by the claims.

The invention claimed is:

1. An analysis method for optimization of a high-speed signal connector, the analysis method comprising:
setting an excess portion of a pin in the high-speed signal connector to be different lengths and setting an excess portion of a pad in the high-speed signal connector to be different lengths;
equating the excess portion of the pin with an inductor and a capacitor, and equating the excess portion of the pad with another inductor and another capacitor;
analyzing performance of connectors having different lengths of the excess portion of the pin and different lengths of the excess portion of the pad, and comparing performance parameters of the connectors; and
obtaining a length of the excess portion of the pin and a length of the excess portion of the pad in a case of an optimal performance parameter, and cutting the pin and the pad based on the length of the excess portion of the pin and the length of the excess portion of the pad in a case of the optimal performance parameter.

2. The analysis method for optimization of the high-speed signal connector according to claim 1, wherein the equating the excess portion of the pin with an inductor and a capacitor and equating the excess portion of the pad with another inductor and another capacitor is performed according to following formulas:

$$L1=4(0.01*D)/(d1/D+0.44),$$

wherein D is a diameter of the pin, and d1 is the length of the excess portion of the pin;

$$L2=4(0.01*D)/(d2/D+0.44),$$

wherein D is the diameter of the pin, and d2 is the length of the excess portion of the pad;

$$C1=4\varepsilon/d1,$$

wherein $\varepsilon$ is a dielectric constant of a dielectric material on which the pin is set, and d1 is the length of the excess portion of the pin; and $$C2=4\varepsilon/d2,$$

wherein $\varepsilon$ is a dielectric constant of a dielectric material on which the pad is set, and d2 is the length of the excess portion of the pad.

3. The analysis method for optimization of the high-speed signal connector according to claim 1, wherein the performance parameter comprises a magnitude of insertion loss, a magnitude of return loss and whether there is a resonance phenomenon.

4. The analysis method for optimization of the high-speed signal connector according to claim 3, wherein the optimal performance parameter is selected based on a criterion that the insertion loss and the return loss are smaller and there is no resonance phenomenon.

5. An analysis system for optimization of a high-speed signal connector, the analysis system comprising:
- a length setting module, configured to set an excess portion of a pin in the high-speed signal connector to be different lengths and set an excess portion of a pad in the high-speed signal connector to be different lengths;
- an equating module configured to equate the excess portion of the pin with an inductor and a capacitor, and equate the excess portion of the pad with another inductor and another capacitor;
- a performance analysis module configured to analyze performance of connectors having different lengths of the excess portion of the pin and different lengths of the excess portion of the pad, and comparing performance parameters of the connectors; and
- a cutting length determining module configured to obtain a length of the excess portion of the pin and a length of the excess portion of the pad in a case of an optimal performance parameter, and cut the pin and the pad based on the length of the excess portion of the pin and the length of the excess portion of the pad in a case of the optimal performance parameter.

6. The analysis system for optimization of the high-speed signal connector according to claim 5, wherein following formulas are used in the equating module:

$$L1=4(0.01*D)/(d1/D+0.44),$$

wherein D is a diameter of the pin, and d1 is the length of the excess portion of the pin;

$$L2=4(0.01*D)/(d2/D+0.44),$$

wherein D is the diameter of the pin, and d2 is the length of the excess portion of the pad;

$$C1=4\varepsilon/d1,$$

wherein $\varepsilon$ is a dielectric constant of a dielectric material on which the pin is set, and d1 is the length of the excess portion of the pin; and $$C2=4\varepsilon/d2,$$

wherein $\varepsilon$ is a dielectric constant of a dielectric material on which the pad is set, and d2 is the length of the excess portion of the pad.

7. The analysis system for optimization of the high-speed signal connector according to claim 5, wherein the performance parameter comprises a magnitude of insertion loss, a magnitude of return loss and whether there is a resonance phenomenon.

8. The analysis system for optimization of the high-speed signal connector according to claim 7, wherein the optimal performance parameter is selected based on a criterion that the insertion loss and the return loss are smaller and there is no resonance phenomenon.

* * * * *